US008626998B1

(12) United States Patent
Amidi et al.

(10) Patent No.: US 8,626,998 B1
(45) Date of Patent: *Jan. 7, 2014

(54) MULTI-RANK MEMORY MODULE THAT EMULATES A MEMORY MODULE HAVING A DIFFERENT NUMBER OF RANKS

(71) Applicant: SMART Modular Technologies, Inc., Newark, CA (US)

(72) Inventors: Mike Hossein Amidi, Lake Forest, CA (US); Kelvin A. Marino, Laguna Hills, CA (US); Satyadev Kolli, Milpitas, CA (US)

(73) Assignee: SMART Modular Technologies, Inc., Newark, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/972,337

(22) Filed: Aug. 21, 2013

Related U.S. Application Data

(63) Continuation of application No. 13/568,694, filed on Aug. 7, 2012, which is a continuation of application No. 10/752,151, filed on Jan. 5, 2004, now Pat. No. 8,250,295.

(51) Int. Cl.
*G06F 12/00* (2006.01)
*G11C 8/00* (2006.01)

(52) U.S. Cl.
USPC ........... 711/105; 711/5; 365/230.03; 365/222

(58) Field of Classification Search
None
See application file for complete search history.

(56) References Cited

U.S. PATENT DOCUMENTS

| | | | |
|---|---|---|---|
| 4,249,253 | A | 2/1981 | Gentili et al. |
| 4,368,515 | A | 1/1983 | Nielsen |
| 4,392,212 | A | 7/1983 | Miyasaka et al. |
| 4,571,676 | A | 2/1986 | Mantellina et al. |
| 4,592,011 | A | 5/1986 | Mantellina et al. |
| 4,633,429 | A | 12/1986 | Lewandowski et al. |
| 4,670,748 | A | 6/1987 | Williams |
| 4,866,603 | A | 9/1989 | Chiba |
| 4,958,322 | A | 9/1990 | Kosugi et al. |
| 4,961,172 | A | 10/1990 | Shubat et al. |

(Continued)

FOREIGN PATENT DOCUMENTS

| | | |
|---|---|---|
| JP | 09237492 A | 9/1997 |
| JP | 1998320270 A | 12/1998 |

(Continued)

OTHER PUBLICATIONS

"JEDEC Standard No. 21-C: PC2100 and PC1600 DDR SDRAM Registered DIMM Design Specification", Revision 1.3, [Online]. Retrieved from the Internet: <URL: http://www.jedec.org/download/search/4_20_04R13.PDF>, (Jan. 2002), 4.20.4: 1-82.

(Continued)

*Primary Examiner* — Kaushikkumar Patel
(74) *Attorney, Agent, or Firm* — Schwegman Lundberg & Woessner, P.A.

(57) ABSTRACT

A transparent four rank memory module has a front side and a back side. The front side has a third memory rank stacked on a first memory rank. The back side has a fourth memory rank stacked on a second memory rank. An emulator coupled to the memory module activates and controls one individual memory rank from either the first memory rank, the second memory rank, the third memory rank, or the fourth memory rank based on the signals received from a memory controller.

19 Claims, 10 Drawing Sheets

BANK EMULATOR BLOCK DIAGRAM

(56) References Cited

U.S. PATENT DOCUMENTS

| | | |
|---|---|---|
| 4,980,850 A | 12/1990 | Morgan |
| 5,060,188 A | 10/1991 | Zulian et al. |
| 5,247,643 A | 9/1993 | Shottan |
| 5,345,412 A | 9/1994 | Shiratsuchi |
| 5,426,753 A | 6/1995 | Moon |
| 5,463,590 A | 10/1995 | Watanabe |
| 5,483,497 A | 1/1996 | Mochizuki et al. |
| 5,495,435 A | 2/1996 | Sugahara |
| 5,581,498 A | 12/1996 | Ludwig et al. |
| 5,590,071 A | 12/1996 | Kolor et al. |
| 5,699,542 A | 12/1997 | Mehta et al. |
| 5,702,984 A | 12/1997 | Bertin et al. |
| 5,703,826 A | 12/1997 | Hush et al. |
| 5,745,914 A | 4/1998 | Connolly et al. |
| 5,802,395 A | 9/1998 | Connolly et al. |
| 5,805,520 A | 9/1998 | Anglada et al. |
| 5,822,251 A | 10/1998 | Bruce et al. |
| RE36,229 E | 6/1999 | Cady |
| 5,926,827 A | 7/1999 | Dell et al. |
| 5,953,280 A | 9/1999 | Matsui |
| 5,959,930 A | 9/1999 | Sakurai |
| 5,963,464 A | 10/1999 | Dell et al. |
| 5,966,736 A | 10/1999 | Gittinger et al. |
| 6,018,787 A | 1/2000 | Ip |
| 6,044,032 A | 3/2000 | Li |
| 6,070,217 A | 5/2000 | Connolly et al. |
| 6,070,227 A | 5/2000 | Rokicki |
| 6,097,652 A | 8/2000 | Roh |
| 6,108,745 A | 8/2000 | Gupta et al. |
| 6,134,638 A | 10/2000 | Olarig et al. |
| 6,151,271 A | 11/2000 | Lee |
| 6,154,418 A | 11/2000 | Li |
| 6,154,419 A | 11/2000 | Shakkarwar |
| 6,185,654 B1 | 2/2001 | Van Doren |
| 6,188,641 B1 | 2/2001 | Uchida |
| 6,205,516 B1 | 3/2001 | Usami |
| 6,209,074 B1 | 3/2001 | Dell et al. |
| 6,226,709 B1 | 5/2001 | Goodwin et al. |
| 6,226,736 B1 | 5/2001 | Niot |
| 6,233,650 B1 | 5/2001 | Johnson et al. |
| 6,247,088 B1 | 6/2001 | Seo et al. |
| 6,260,127 B1 | 7/2001 | Olarig et al. |
| 6,317,352 B1 | 11/2001 | Halbert et al. |
| 6,400,637 B1 | 6/2002 | Akamatsu et al. |
| 6,408,356 B1 | 6/2002 | Dell |
| 6,414,868 B1 | 7/2002 | Wong et al. |
| 6,415,374 B1 | 7/2002 | Faue et al. |
| 6,438,062 B1 | 8/2002 | Curtis et al. |
| 6,446,158 B1 | 9/2002 | Karabatsos |
| 6,446,184 B2 | 9/2002 | Dell et al. |
| 6,453,381 B1 | 9/2002 | Yuan et al. |
| 6,470,417 B1 | 10/2002 | Kolor et al. |
| 6,480,439 B2 | 11/2002 | Tokutome et al. |
| 6,487,102 B1 | 11/2002 | Halbert et al. |
| 6,502,161 B1 | 12/2002 | Perego et al. |
| 6,518,794 B2 | 2/2003 | Coteus et al. |
| 6,526,473 B1 | 2/2003 | Kim |
| 6,530,007 B2 | 3/2003 | Olarig et al. |
| 6,530,033 B1 | 3/2003 | Raynham et al. |
| 6,553,450 B1 | 4/2003 | Dodd et al. |
| 6,618,320 B2 | 9/2003 | Hasegawa et al. |
| 6,621,496 B1 | 9/2003 | Ryan |
| 6,625,081 B2 | 9/2003 | Roohparvar et al. |
| 6,625,687 B1 | 9/2003 | Halbert et al. |
| 6,636,935 B1 | 10/2003 | Ware et al. |
| 6,639,820 B1 | 10/2003 | Khandekar et al. |
| 6,646,949 B1 | 11/2003 | Ellis et al. |
| 6,658,509 B1 | 12/2003 | Bonella et al. |
| 6,674,684 B1 | 1/2004 | Shen |
| 6,681,301 B1 | 1/2004 | Mehta et al. |
| 6,683,372 B1 | 1/2004 | Wong et al. |
| 6,697,888 B1 | 2/2004 | Halbert et al. |
| 6,705,877 B1 | 3/2004 | Li et al. |
| 6,717,855 B2 | 4/2004 | Underwood et al. |
| 6,717,885 B2 | 4/2004 | Lai |
| 6,738,880 B2 | 5/2004 | Lai et al. |
| 6,742,098 B1 | 5/2004 | Halbert et al. |
| 6,754,797 B2 | 6/2004 | Wu et al. |
| 6,785,189 B2 | 8/2004 | Jacobs et al. |
| 6,788,592 B2 | 9/2004 | Nakata et al. |
| 6,807,125 B2 | 10/2004 | Coteus et al. |
| 6,807,650 B2 | 10/2004 | Lamb et al. |
| 6,813,196 B2 | 11/2004 | Park et al. |
| 6,834,014 B2 | 12/2004 | Yoo et al. |
| 6,854,042 B1 | 2/2005 | Karabatsos |
| 6,880,094 B2 | 4/2005 | LaBerge |
| 6,889,304 B2 | 5/2005 | Perego et al. |
| 6,912,615 B2 | 6/2005 | Nicolai |
| 6,912,628 B2 | 6/2005 | Wicki et al. |
| 6,925,028 B2 | 8/2005 | Hosokawa et al. |
| 6,944,694 B2 | 9/2005 | Pax |
| 6,950,366 B1 | 9/2005 | Lapidus et al. |
| 6,961,281 B2 | 11/2005 | Wong et al. |
| 6,968,440 B2 | 11/2005 | Brueggen |
| 6,970,968 B1 | 11/2005 | Holman |
| 6,981,089 B2 | 12/2005 | Dodd et al. |
| 6,982,892 B2 | 1/2006 | Lee et al. |
| 6,982,893 B2 | 1/2006 | Jakobs |
| 6,990,043 B2 | 1/2006 | Kuroda et al. |
| 6,996,686 B2 | 2/2006 | Doblar et al. |
| 7,007,130 B1 | 2/2006 | Holman |
| 7,007,175 B2 | 2/2006 | Chang et al. |
| 7,046,538 B2 | 5/2006 | Kinsley et al. |
| 7,054,179 B2 | 5/2006 | Cogdill et al. |
| 7,065,626 B2 | 6/2006 | Schumacher et al. |
| 7,073,041 B2 | 7/2006 | Dwyer et al. |
| 7,078,793 B2 | 7/2006 | Ruckerbauer et al. |
| 7,120,727 B2 | 10/2006 | Lee et al. |
| 7,124,260 B2 | 10/2006 | LaBerge et al. |
| 7,127,584 B1 | 10/2006 | Thompson et al. |
| 7,130,952 B2 | 10/2006 | Nanki et al. |
| 7,133,960 B1 | 11/2006 | Thompson et al. |
| 7,133,972 B2 | 11/2006 | Jeddeloh |
| 7,142,461 B2 | 11/2006 | Janzen |
| 7,149,841 B2 | 12/2006 | LaBerge |
| 7,155,627 B2 | 12/2006 | Matsui |
| 7,167,967 B2 | 1/2007 | Bungo et al. |
| 7,181,591 B2 | 2/2007 | Tsai |
| 7,200,021 B2 | 4/2007 | Raghuram |
| 7,227,910 B2 | 6/2007 | Lipka |
| 7,266,634 B2 | 9/2007 | Ware et al. |
| 7,266,639 B2 | 9/2007 | Raghuram |
| 7,272,709 B2 | 9/2007 | Zitlaw et al. |
| 7,281,079 B2 | 10/2007 | Bains et al. |
| 7,286,436 B2 | 10/2007 | Bhakta et al. |
| 7,289,386 B2 | 10/2007 | Bhakta et al. |
| 7,346,750 B2 | 3/2008 | Ishikawa |
| 7,356,639 B2 | 4/2008 | Perego et al. |
| 7,363,422 B2 | 4/2008 | Perego et al. |
| 7,370,238 B2 | 5/2008 | Billick et al. |
| 7,437,591 B1 | 10/2008 | Wong |
| 7,461,182 B2 | 12/2008 | Fukushima et al. |
| 7,471,538 B2 | 12/2008 | Hofstra |
| 7,532,537 B2 | 5/2009 | Solomon et al. |
| 7,619,912 B2 | 11/2009 | Bhakta et al. |
| 7,636,274 B2 | 12/2009 | Solomon et al. |
| 7,864,627 B2 | 1/2011 | Bhakta et al. |
| 7,881,150 B2 | 2/2011 | Solomon et al. |
| 7,916,574 B1 | 3/2011 | Solomon et al. |
| 8,001,434 B1 | 8/2011 | Lee et al. |
| 8,072,837 B1 | 12/2011 | Solomon et al. |
| 8,081,535 B2 | 12/2011 | Bhakta et al. |
| 8,081,536 B1 | 12/2011 | Solomon et al. |
| 8,081,537 B1 | 12/2011 | Bhakta et al. |
| 8,154,901 B1 | 4/2012 | Lee |
| 8,250,295 B2 | 8/2012 | Amidi et al. |
| 8,417,870 B2 | 4/2013 | Lee et al. |
| 2001/0003198 A1 | 6/2001 | Wu |
| 2001/0004753 A1 | 6/2001 | Dell et al. |
| 2001/0052057 A1 | 12/2001 | Lai et al. |
| 2002/0024834 A1 | 2/2002 | Jeon et al. |
| 2002/0039323 A1 | 4/2002 | Tokutome et al. |
| 2002/0088633 A1 | 7/2002 | Kong et al. |
| 2003/0063514 A1 | 4/2003 | Faue |

(56) References Cited

U.S. PATENT DOCUMENTS

| | | | |
|---|---|---|---|
| 2003/0090359 A1 | 5/2003 | Ok |
| 2003/0090879 A1 | 5/2003 | Doblar et al. |
| 2003/0191995 A1 | 10/2003 | Abrosimov et al. |
| 2003/0210575 A1 | 11/2003 | Seo et al. |
| 2004/0000708 A1 | 1/2004 | Rapport et al. |
| 2004/0037158 A1 | 2/2004 | Coteus et al. |
| 2004/0201968 A1 | 10/2004 | Tafolla |
| 2005/0036378 A1 | 2/2005 | Kawaguchi et al. |
| 2005/0138267 A1 | 6/2005 | Bains et al. |
| 2005/0281096 A1 | 12/2005 | Bhakta et al. |
| 2006/0044860 A1 | 3/2006 | Kinsley et al. |
| 2006/0117152 A1 | 6/2006 | Amidi et al. |
| 2006/0126369 A1 | 6/2006 | Raghuram |
| 2006/0129755 A1 | 6/2006 | Raghuram |
| 2006/0179206 A1 | 8/2006 | Brittain et al. |
| 2006/0259711 A1 | 11/2006 | Oh |
| 2006/0267172 A1 | 11/2006 | Nguyen et al. |
| 2006/0277355 A1 | 12/2006 | Ellsberry et al. |
| 2008/0046631 A1 | 2/2008 | Takaku et al. |
| 2010/0128507 A1 | 5/2010 | Solomon et al. |
| 2011/0016250 A1 | 1/2011 | Lee et al. |
| 2011/0016269 A1 | 1/2011 | Lee et al. |
| 2011/0090749 A1 | 4/2011 | Bhakta et al. |
| 2011/0125966 A1 | 5/2011 | Amidi et al. |
| 2013/0036264 A1 | 2/2013 | Amidi et al. |

FOREIGN PATENT DOCUMENTS

| | | |
|---|---|---|
| JP | 2000285674 A | 10/2000 |
| JP | 2002184176 A | 6/2002 |
| JP | 2003007963 A | 1/2003 |
| JP | 2008046989 A | 2/2008 |
| WO | WO-9202879 A1 | 2/1992 |
| WO | WO-9407242 A1 | 3/1994 |
| WO | WO-9534030 A2 | 12/1995 |
| WO | WO-02058069 A2 | 7/2002 |
| WO | WO-03017283 A1 | 2/2003 |
| WO | WO-03069484 A2 | 8/2003 |
| WO | WO-2006055497 A2 | 5/2006 |

OTHER PUBLICATIONS

"8M-Word by 64-bit Synchronous Dynamic RAM Module Unbuffered Type", NEC Corporation, MOS Integrated Circuit MC-458CB646, (1997), 16 pgs.

"U.S. Appl. No. 13/568,694, Examiner Interview Summary mailed Nov. 8, 2013", 3 pgs.

"U.S. Appl. No. 95/002,399, Claim Charts JEDEC 21C in View of APA, MATSUI, and JEDEC 79C", (Apr. 25, 2013), 17 pgs.

"U.S. Appl. No. 95/002,399, Claim Charts JEDEC 21C in View of APA, Watanabe, and JEDEC 79C", (Apr. 25, 2013), 16 pgs.

"U.S. Appl. No. 95/002,399, Claim Charts Takeda in View of JEDEC 21-C and JEDEC 79C", (Apr. 25, 2013), 12 pgs.

"U.S. Appl. No. 95/002,399, Declaration of Dr. Edward P. Sayre Pursuant to 37 CFT 1.132 filed Apr. 25, 2013", 42 pgs.

"U.S. Appl. No. 95/002,399, Third Party Requester Comments After Patent Owner Response Pursuant to 37 CFR 1.947 filed Apr. 25, 2013", 44 pgs.

"U.S. Appl. No. 95/002,399, Third Party Requester Comments to Patent Owner's Response of Jul. 5, 2011 and in Response to the Office's Decision Granting Petition to Waive Page Limit of Jul. 29, 2011 Under 37 CFR 1.947 filed Aug. 29, 2011", 5 pgs.

"JEDEC Standard No. JESD79C: Double Data Rate (DDR) SDRAM Specification", Revision of JESD79B, (Mar. 2003), 82 pgs.

Portion of Request for Inter Partes Reexamination of U.S. Patent No. 7,289,386, corresponding to U.S. Appl. No. 95/000,577, Oct. 20, 2010, 286 pages.

Request for Inter Partes Reexamination; U.S. Appl. No. 95/000,577 for U.S. Pat. No. 7,289,386 filed Oct. 20, 2010.

Deposition of William Hoffman, (May 18, 2010), 9 pgs.

The Authoritative Dictionary of IEEE Standard Terms, Seventh Ed., (2000), 5 pgs.

New Oxford American Dictionary, 2nd. Edition, (2005), 1193.

20110125966 File History, (Aug. 12, 2011), 296 pgs.

Google's Invalidity Contentions and exhibits 6 and 14, (Jul. 16, 2010), 59 pgs.

DM74LS138 • DM74LS139, Decoder/Demultiplexer, Fairchild Semiconductor Corp., Aug. 1986, Revised Mar. 2000 (GNET001928-1935), (Aug. 1986).

"§2173.05(g)", Manual of Patent Examining Procedure, (Jul. 2008), 4 pgs.

"66/100 MHz PC SDRAM 64-Bit Non-ECCParity 144 Pin Unbuffered SO-DIMM Specification, Revision 1.0", Intel Corporation, (Feb. 1999), 28 pgs.

"U.S. Appl. No. 11/142,989, filed Dec. 7, 2006 and its entire prosecution history".

"U.S. Appl. No. 11/335,875, filed Jan. 19, 2006", Owned by Netlist, Inc.

"U.S. Appl. No. 10/752,151, Appeal Brief filed Mar. 28, 2008", 20 pgs.

"U.S. Appl. No. 10/752,151, Examiner Interview Summary mailed Jul. 18, 2007", 2 pgs.

"U.S. Appl. No. 10/752,151, Examiner's Answer to Appeal Brief mailed Oct. 24, 2008", 20 pgs.

"U.S. Appl. No. 10/752,151, Examiner's Interview Summary mailed Jan. 12, 2012", 3 pgs.

"U.S. Appl. No. 10/752,151, Final Office Action mailed Sep. 28, 2007", 16 pgs.

"U.S. Appl. No. 10/752,151, Final Office Action mailed Nov. 8, 2006", 12 pgs.

"U.S. Appl. No. 10/752,151, Non Final Office Action mailed Feb. 24, 2006", 7 pgs.

"U.S. Appl. No. 10/752,151, Non Final Office Action mailed Apr. 16, 2007", 15 pgs.

"U.S. Appl. No. 10/752,151, Non Final Office Action mailed Sep. 2, 2011", 6 pgs.

"U.S. Appl. No. 10/752,151, Non Final Office Action mailed Dec. 13, 2010", 12 pgs.

"U.S. Appl. No. 10/752,151, Notice of Allowance mailed Apr. 5, 2012", 8 pgs.

"U.S. Appl. No. 10/752,151, PTO Response to Rule 312 Communication mailed Jul. 13, 2012", 6 pgs.

"U.S. Appl. No. 10/752,151, Response filed Feb. 8, 2007 to Final Office Action mailed Nov. 8, 2006", 13 pgs.

"U.S. Appl. No. 10/752,151, Response filed Feb. 2, 2012 to Non Final Office Action mailed Sep. 2, 2011", 6 pgs.

"U.S. Appl. No. 10/752,151, Response filed Jun. 7, 2011 to Non Final Office Action mailed Dec. 13, 2010", 6 pgs.

"U.S. Appl. No. 10/752,151, Response filed Jun. 8, 2010 to Final Office Action mailed Sep. 28, 2007", 8 pgs.

"U.S. Appl. No. 10/752,151, Response filed Jun. 26, 2006 to Non Final Office Action mailed Fe. 24, 2006", 13 pgs.

"U.S. Appl. No. 10/752,151, Response filed Jul. 3, 2012 to Notice of Allowance and Notice of Allowability mailed Apr. 5, 2012", 11 pgs.

"U.S. Appl. No. 10/752,151, Response filed Jul. 16, 2007 to Non Final Office Action mailed Apr. 16, 2007", 15 pgs.

"U.S. Appl. No. 10/752,151, Supplemental Appeal Brief filed May 14, 2008", 24 pgs.

"U.S. Appl. No. 10/752,151, Supplemental Appeal Brief filed Aug. 8, 2008", 24 pgs.

"U.S. Appl. No. 10/752,151, Supplemental Notice of Allowability mailed Jun. 12, 2012", 4 pgs.

"U.S. Appl. No. 12/902,073, Communication Regarding Claims Copied from U.S. Patent No. 7,619,912 mailed Oct. 11, 2010", 2 pgs.

"U.S. Appl. No. 12/902,073, Communication Regarding Claims Copied from U.S. Patent No. 7,619,912 mailed Nov. 16, 2010", 2 pgs.

"U.S. Appl. No. 12/902,073, Preliminary Amendment mailed Nov. 16, 2010", 21 pgs.

"U.S. Appl. No. 13/568,694, Non Final Office Action mailed Jun. 24, 2013", 10 pgs.

"U.S. Appl. No. 13/568,694, Preliminary Amendment filed Aug. 7, 2012", 3 pgs.

"U.S. Appl. Nos. 95/000,578, 95/000,579 and 95/001,339 (Merged) Partial Prosecution History", (from Apr. 15, 2011 to Feb. 2, 2012), 1719 pgs.

(56) References Cited

OTHER PUBLICATIONS

"U.S. Appl. No. 95/000,578, Partial Prosecution History", (from Oct. 20, 2010 to Jul. 29, 2011), 1687 pgs.
"U.S. Appl. No. 95/000,578, Partial Prosecution History", (from Aug. 29, 2011 to Aug. 29, 2011), 1991 pgs.
"U.S. Appl. No. 95/000,578, Partial Prosecution History", (from Oct. 4, 2011 to Dec. 27, 2012), 1053 pgs.
"U.S. Appl. No. 95/000,578, Partial Prosecution History", (from Jan. 14, 2013 to Jun. 10, 2013), 427 pgs.
"U.S. Appl. No. 95/000,579, Partial Prosecution History", (from Oct. 21, 2010 to Nov. 30, 2011), 1160 pgs.
"U.S. Appl. No. 95/000,579, Partial Prosecution History", (from Jan. 14, 2012 to Jan. 14, 2013), 948 pgs.
"U.S. Appl. No. 95/000,579, Partial Prosecution History", (from Feb. 13, 2013 to Feb. 13, 2013), 384 pgs.
"U.S. Appl. No. 95/000,579, Partial Prosecution History", (from Feb. 13, 2013 to Jun. 10, 2013), 341 pages.
"U.S. Appl. No. 95/001,339, Partial Prosecution History", (from Apr. 20, 2010 to Jul. 29, 2011), 822 pgs.
"U.S. Appl. No. 95/001,339, Partial Prosecution History", (from Jul. 29, 2011 to Feb. 10, 2012), 812 pgs.
"U.S. Appl. No. 95/001,339, Partial Prosecution History", (from Feb. 13, 2012 to Dec. 27, 2012), 777 pgs.
"U.S. Appl. No. 95/001,339, Partial Prosecution History", (from Jan. 14, 2013 to Jun. 10, 2013), 511 pgs.
"U.S. Appl. No. 95/002,399 Prosecution History", From Sep. 15, 2012 to Jul. 12, 2013, 609 pgs.
"Bank Address Definition", JEDEC Dictionary of Terms for Solid State Technology, 5th Edition, (2009), 14.
"Bank Striping of Data Across Internal SDRAM Banks", IP.com, IP.com No. IPCOM000013697D, (2003).
"DDR SDRAM RDIMM, MT36VDDF12872-1GB, MT36VDDF25672-2GB", Micron Technology, Inc., (2002), 20 pgs.
"DDR2 SDRAM Registered DIMM (RDIMM)", Micron Technology, Inc., (2003), 18 pgs.
"Decoupling Capacitor Calculation for a DDR Memory Channel", Micron, Technical Note, (2004), 3 pgs.
"Defendant Netlist, INC.'s Opening Claim Construction Brief", United States District Court, Northern District of California, Oakland Division, Case4:08-cv-04144-SBA Document 44, (Filed Jul. 28, 2009), 23 pgs.
"Distributed Memory Mapping", IP.com, IP.com No. IPCOM000014788D, (2000).
"DM74LS138 DM74LS139 DecoderDemultiplexer", Fairchild Semiconductor Corporation, (2000).
"Elpida Memory to Speak at Intel's Memory Implementers Forum Roundtable Event", Elpida Memory Inc., presented at the Intel Developer Forum, [Online]. Retrieved from the Internet: <URL: http://www.elpida.com/en/news/2004/02-18.html>, (Feb. 18, 2004), 2 pgs.
"Exhibit A", Excerpts from the deposition transcript of Richard Turley, (May 13, 2010), 13 pgs.
"HP Printer Memory Explained", The ZonkPage. Last Updated Jan. 21, 2004. Accessed Jun. 28, 2013, [Online]. Retrieved from the Internet: <http://warshaft.com/hpmem.htm>, 7 pgs.
"Hynix HYMD512G726(L)8-K/H/L", Registered DDR SDRAM DIMM, 128Mx72 bits Product Description, Rev. 0.1, (May 2002), 16 pgs.
"Information Huawei or FPGA-Take Five", Electronic News, (2002), 2 pgs.
"JEDEC Standard No, 21-C: 200 Pin, PC2700/PC2100/PC1600 DDR SDRAM Unbuffered SO-DIMM Reference Design Specification", Revision 1.1, Release 11b, (Apr. 26, 2002), 4.20.6: 1-28.
"JEDEC Standard No. 21-C: 144 Pin, PC133 SDRAM Registered Unbuffered SO-DIMM, Reference Design Specification", Revision 1.02, Release 11, (Oct. 2003), 4.20.3: 1-26.
"JEDEC Standard No. 21-C: 168 Pin, PC133 SDRAM Registered DIMM Design Specification", Revision 1.4, Release 11a, (Feb. 2002), 4.20.2: 1-75.
"JEDEC Standard No. 21-C: 184 Pin. PC1600/2100 DDR SDRAM Unbuffered DIMM Design Specification", Revision 1.1, Release 11b, (Apr. 2003), 4.20.5: 1-40.
"JEDEC Standard No. 21-C: 64 & 72 PIN ZIP/SIMM SRAM Module", Release 6, [Online]. Retrieved from the Internet: <URL: http://www.jedec.org/standards-documents>, (Jun. 1997), 4.4.1: 1-2.
"JEDEC Standard No. JESD82-4B: Definition of the SSTV16859 2.5 V 13-Bit to 26-Bit SSTL_2 Registered Buffer for Stacked DDR DIMM Applications", Revision of JESD82-4A, (May 2003), 17 pgs.
"Letter from G. Hopkins Guy III,", Orrick, Herrington & Sutcliffe LLP, to R. Scott Oliver, Morrison & Foerster, (Apr. 14, 2009).
"Memory technology evolution: an overview of system memory technologies", Hewlett-Packard, 7th Edition, (2003).
"Method for a high-performance DRAM address mapping mechanism", IP.com, IP.com No. IPCOMOOOOO8164D, (2002).
"Method for memory probing on a multiple-DIMM bus", IP.com, IP.com No. IPCOM000019063D, (2003).
"Method for multiple device interface testing using a single device", IP.com, IP.com No. IPCOM000010054D, (2002).
"MPC8260 SDRAM Support", Freescale Semiconductor, Inc., Application Note, Document No. AN2165/D, Rev. 1, (Oct. 2006).
"PACER Document 45—Claim Construction Statement", 4:09-cv-05718-SBA *Netlist, Inc. v. Google Inc.*, (Jun. 25, 2010), 5 pgs.
"PACER Document 45—Exhibit B to Joint Claim Construction", 4:09-cv-05718-SBA *Netlist, Inc. v. Google Inc.*, (Jun. 25, 2010), 23 pgs.
"PACER Document 45 Exhibit A to Joint Claim Construction", 4:09-cv-05718-SBA *Netlist, Inc. v. Google Inc.*, (Jun. 25, 2010), 2 pgs.
"PACER Document 48—Claim Construction Statement", 4:09-cv-05718-SBA *Netlist, Inc. v. Google Inc.*, (Jul. 16, 2010), 29 pgs.
"PACER Document 48—Declaration of Steven R. Hansen in Support of Plaintiff Netlist, Inc.'s Opening Claim Construction Brief", 4:09-cv-05718-SBA *Netlist, Inc. v. Google Inc.*, (Jul. 16, 2010), 3 pgs.
"PACER Document 48—Exhibit A to Decl. of Steven R. Hansen", 4:09-cv-05718-SBA *Netlist, Inc. v. Google Inc.*, (Jul. 16, 2010), 41 pgs.
"PACER Document 48—Exhibits B-G to Decl. of Steven R. Hansen", 4:09-cv-05718-SBA *Netlist, Inc. v. Google Inc.*, (Jul. 16, 2010), 89 pgs.
"PACER Document 49—Affidavit", 4:09-cv-05718-SBA *Netlist, Inc. v. Google Inc.*, (Aug. 4, 2010), 2 pgs.
"PACER Document 49—Claim Construction Statement", 4:09-cv-05718-SBA *Netlist, Inc. v. Google Inc.*, (Aug. 4, 2010), 27 pgs.
"PACER Document 49—Exhibit A", 4:09-cv-05718-SBA *Netlist, Inc. v. Google Inc.*, (Aug. 4, 2010), 13 pgs.
"PACER Document 49—Exhibit B", 4:09-cv-05718-SBA *Netlist, Inc. v. Google Inc.*, (Aug. 4, 2010), 41 pgs.
"PACER Document 49—Exhibit C", 4:09-cv-05718-SBA *Netlist, Inc. v. Google Inc.*, (Aug. 4, 2010), 6 pgs.
"PACER Document 49—Exhibit D", 4:09-cv-05718-SBA *Netlist, Inc. v. Google Inc.*, (Aug. 4, 2010), 19 pgs.
"PACER Document 50—Reply Memorandum", 4:09-cv-05718-SBA *Netlist, Inc. v. Google Inc.*, (Aug. 16, 2010), 17 pgs.
"PACER Document 63—Declaration in Support", 4:09-cv-05718-SBA *Netlist, Inc. v. Google Inc.*, (Nov. 5, 2010), 3 pgs.
"PACER Document 68—Order", 4:09-cv-05718-SBA *Netlist, Inc. v. Google Inc.*, (Jan. 26, 2011), 2 pgs.
"PACER Document 69—Patent/Trademark Copy", 4:09-cv-05718-SBA *Netlist, Inc. v. Google Inc.*, (Jan. 27, 2011), 3 pgs.
"PACER Document 70—Status Report", 4:09-cv-05718-SBA *Netlist, Inc. v. Google Inc.*, (Jul. 25, 2011), 13 pgs.
"PC SDRAM Registered DIMM Design Support Document, Revision 1.2", Intel Corporation, (Oct. 1998), 61 pgs.
"PC133 SDRAM Registered DIMM", Design Specification, Rev 1.1, (Aug. 1999), 62 pgs.
"Plaintiff Netlist, Inc.'s Opening Claim Construction Brief", United States District Court, Northern District of California, Oakland Division, Case 4:09-cv-05718-SBA, Document 48, (Filed Jul. 16, 2010), 162 pgs.
"Quad Band Memory (QBM); DDR 200/266/333 devices producing DDR 400/533/667", Platform Conference, (Jan. 23-24, 2002).
"Synchronous DRAM Module MT18LSDT472", Micron Technology Inc., (1998), 17 pgs.

(56) References Cited

OTHER PUBLICATIONS

"TM2SR72EPN 2097152 by 72-BIT, TM4SRT2EPN 4194304 by 72-BIT, Synchronous Dynamic RAM Modules", Texas Instruments, (1997), 15 pgs.
"Understanding DRAM Operation", IBM, Application Note, (Dec. 1996), 10 pgs.
"WSI Aims Programmable MCU Peripherals at DSPs", Electronic Buyers News, n. 927, (1994), 39.
Abali, B., "Memory Expansion Technology (MXT): Software Support and Performance", IBM J. Res. & Dev., 45(2), (2001), 287-300.
Arlington, D. L, et al., "Enhancement of Memory Card Redundant Bit Usage Via Simplified Fault Alignment Exclusion", IBM Technical Disclosure Bulletin, (1987).
Arroyo, R. X, et al., "Method of executing Manufacturing ROM Code Without Removing System Roms", IP.Com, IP.com No. IPCOM000037214D, (1989).
Barr, Michael, "Programmable Logic: What's it to Ya?", Embedded Systems Programming, (Jun. 1999), 75-84.
Bennayoun, A., et al., "Input/Output Chip Select Doubler", IBM Technical Disclosure Bulletin, 38(4), (1995), 237-240.
Blum, A., et al., "Fast Multichip Memory System With Power Select Signal", IBM Technical Disclosure Bulletin, (1979).
Carvalho, Carlos, "The Gap between Processor and Memory Speeds", ICCA '02, (2002), 8 pgs.
Cuppu, V., et al., "A performance comparison of contemporary DRAM architectures", Proceedings of the 26th International Symposium on Computer Architecture, 1999., 222-233.
Cuppu, V., et al., "Concurrency, latency, or system overhead: Which has the largest impact on uniprocessor DRAM-system performance?", 28th Annual International Symposium on Computer Architecture, 2001. Proceedings., 62-71.
Cuppu, V., et al., "High-performance DRAMs in workstation environments", IEEE Transactions on Computers, 50(11), (2001), 1133-1153.
Denneau, M., "Logic Processor for Logic Simulation Machine", IBM Technical Disclosure Bulletin, 25(1), (1982).
Fitzgerald, B. F, et al., "Chip Select Circuit for Multi-Chip RAM Modules", IP.com, IP.com No. IPCOM000044404D, (1984).
Freedman, Alan, The Computer Glossary,• The Complete Illustrated Dictionary, American Management Association, 2001.
Gray, K. S, "Fet Ram Chip Double Density Scheme", IP.com, IP.com No. IPCOM000043942D, (1984).
Grimes, W. D, et al., "Access Rate/Availability Improvement Logic for Dynamic Memories", IBM Technical Disclosure Bulletin, (Oct. 1982).
Gupta, P., et al., "Designing and implementing a fast crossbar scheduler", IEEE Micro, 19(1), (1999), 20-28.
Hession, J., et al., "Chip Select Technique for Multi Chip Decoding", IP.com, IP.com No. IPCOM000070404D, (1978).
Hoare, R., et al., "An 88-Way Multiprocessor Within an FPGA With Customizable Instructions", Proceedings of the 18th International Parallel and Distributed Processing Symposium, (2004), 8 pgs.
Jacob, Bruce L, "Synchronous DRAM Architectures, Organizations, and Alternative Technologies", University of Maryland, (Dec. 10, 2002).
Jin, Huang, "Embedded Memory in System-On-Chip Design: Architecture and Prototype Implementation", Canadian Conference on Electrical and Computer Engineering, 2003. IEEE CCECE 2003., (2003), 141-146.
Jin, Huang, et al., "Prototype implementation and evaluation of a multibank embedded memory architecture in programmable logic", 2003 IEEE Pacific Rim Conference on Communications, Computers and signal Processing, 2003. PACRIM., 13-16.
Kane, M. H, et al., "Read Only Store Memory Extension", IP.com, IP.com No. IPCOM0000828450, (1975).
Karabatsos, Chris, "Quad Band Memory (QBM) Technology", Kentron Technologies, Inc., (Apr. 2001), 1-5.

Kellog, Mark, "PC133: SDRAM Main Memory Performance Reaches New Heights", IBM Microelectronics, (1999).
Keltcher, C. N, et al., "The AMD Opteron processor for multiprocessor servers", IEEE Micro, 23(2), (2003), 66-76.
Kirihata, T., et al., "A 390-mm2, 16-bank, 1-Gb DDR SDRAM with hybrid bitline architecture", IEEE Journal of Solid-State Circuits, 34(11), (Nov. 11, 1999), 1580-1588.
Kornaros, G., et al., "A Fully-Programmable Memory Management System Optimizing Queue Handling at Multi Gigabit Rates", DAC '03 Proceedings of the 40th annual Design Automation Conference, (2003), 54-59.
Lee, J., et al., "A banked-promotion translation lookaside buffer system", Journal of Systems Architecture, 47, (2002), 1065-1078.
Lee, J., et al., "An on-chip cache compression technique to reduce decompression overhead and design complexity", Journal of Systems Architecture, 46, (2000), 1365-1382.
Lin, Wei-Fen, et al., "Designing a modern memory hierarchy with hardware prefetching", IEEE Transactions on Computers, 50(1), (2001), 1202-1218.
Luthra, M., et al., "Interface Synthesis Using Memory Mapping for an FPGA Platform", Proceedings of the 21st International Conference on Computer Design, (2003), 6 pgs.
Matick, R. E, "Logic and Decoder Arrangement for Controlling SpillWrap Boundaries of a Bit-Addressable Memory Decoder", IBM Technical Disclosure Bulletin, (1984).
Matick, R. E, "Read-Select Capability for Static Random-Access Memory", IBM Technical Disclosure Bulletin, (1985), 6640-6642.
Meyers, R. F, "Use of Partially Good Memory Chips", IP.com, IP.com No. IPCOM000066246D, (1979).
Murdocca, Miles J, et al., Principles of Computer Architecture, (2000), 249-251.
Murdocca, Miles J., Principles of Computer Architecture, Prentice Hall, Inc., Upper Saddle River, NJ, (2000), 243-252.
Ofek, H., et al., "Partial Two Way Mapping Technique", IBM Technical Disclosure Bulletin, 1969, 429-430.
Paldan, D., "Programmable Memory Address Decoding for Microprocessor Memory Device", IP.com, IP.com No. IPCOM000005486D, (1983).
Pellinger, R. D., "Dual Addressable Memory", IBM Technical Disclosure Bulletin, vol. 20, No. 8, IPCOM000068610D, (Jan. 1978), 3259-3260.
Plotnick, N., "Shuffle Your Chips for Better Performance", PC Week, (1998), 90.
Schubert, K. D, et al., "Accelerating system integration by enhancing hardware, firmware, and co-simulation," IBM J. Res. & Dev, 48(34), (May/Jul. 2004), 569-581.
Skelton, M. H, "Program Controlled Paging Scheme for Memory Expansion", IP.com, IP.com No. IPCOM000050954D, (1982).
Slegel, T. J, et al., "IBM's S390 G5 Microprocessor Design", IEEE Micro, 19(2), (1999), 12-23.
Smith, B. A, "Chip Select Decoder Circuit", IP.com, IP.com No. IPCOM000063400D, (1985).
Stelzer, K. C, "Planar Memory Boundary Registers with Remap Feature", IBM Technical Disclosure Bulletin, (1993).
Sunaga, T., et al., "An Enable Signal Circuit for Multiple Small Banks", IP.com, IP.com No. IPCOM000123375D, (1998).
Sunaga, T., et al., "Continuous RAS Access Method in Multiple-bank DRAM Chip", IP.com, IP.com No. IPCOMOOO123375D, (1998).
Toal, C., et al., "A 32-Bit SoPC Implementation of a P5", Proceedings of the Eighth IEEE International Symposium on Computers and Communications, (2003), 1530-1346.
Tudruj, M., et al., "Dynamically reconfigurable heterogeneous multiprocessor systems with transputer-controlled communication", Journal of Systems Architecture, 43, (1997), 27-32.
Vogt, P., "Fully Buffered DIMM (FB-DIMM) Server Memory Architecture:", Intel Developer Forum, (Feb. 18, 2004), 33 pgs.
Yao, Y. L, "High Density Memory Selection Circuit", IP.com, IP.com No. IPCOM000078218D, (1972).

OVERALL BLOCK DIAGRAM OF STANDARD MEMORY INTERFACE

STANDARD DDR DEVICE DEPTH STACKING BLOCK DIAGRAM

TRANSPARENT FOUR RANK DDR MODULE BLOCK DIAGRAM

TRANSPARENT 72-BIT REGISTERED DDR MODULE FRONT SIDE

TRANSPARENT 72-BIT REGISTERED DDR MODULE BACK SIDE

| ADD(n) | CS1 | CS0 | ACTIVE BANK |
|--------|-----|-----|-------------|
| 0 | 1 | 0 | 0 |
| 0 | 0 | 1 | 1 |
| 1 | 1 | 0 | 2 |
| 1 | 0 | 1 | 3 |

TRUTH TABLE

*Fig. 5*

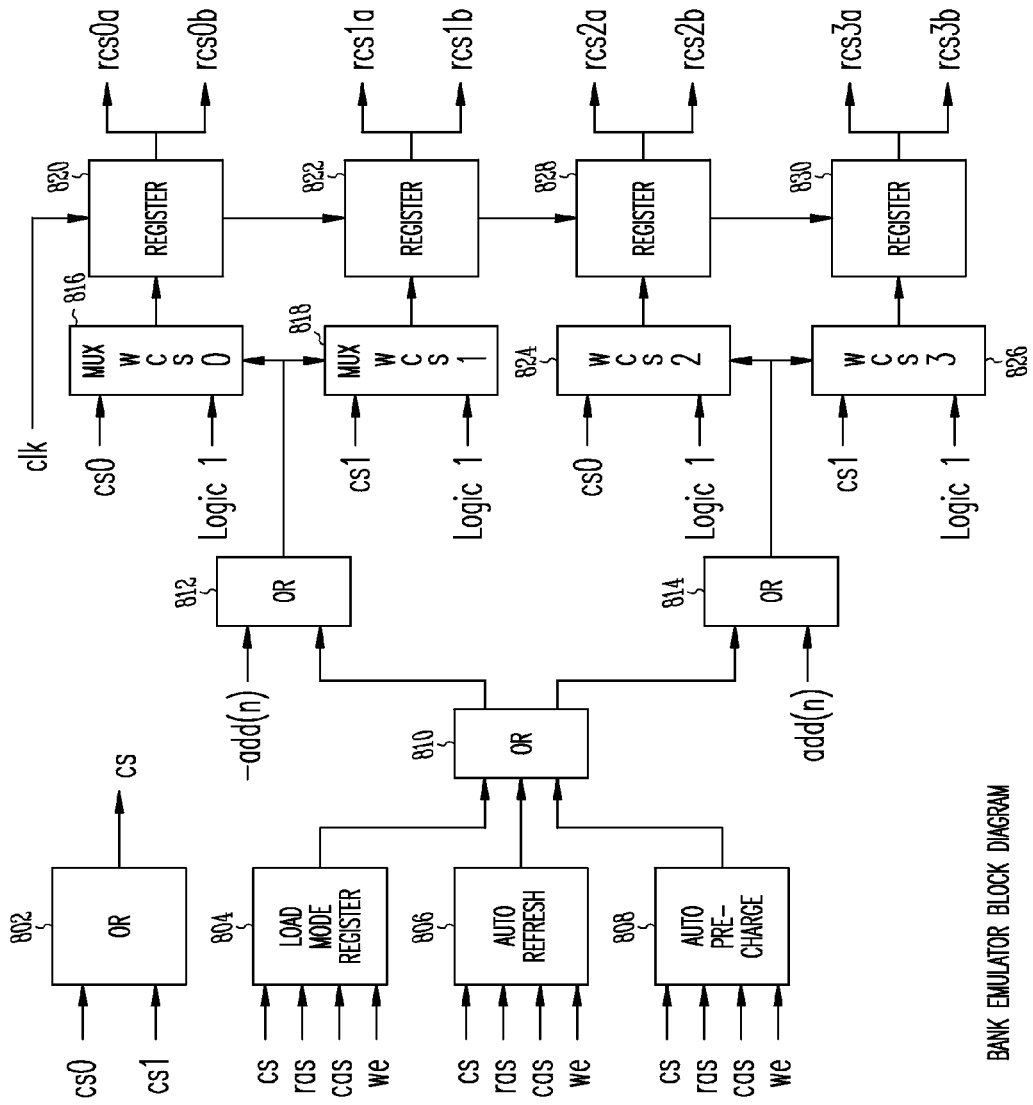

MULTI-RANK MEMORY MODULE THAT EMULATES A MEMORY MODULE HAVING A DIFFERENT NUMBER OF RANKS

RELATED APPLICATIONS

This application is a Continuation of U.S. application Ser. No. 13/568,694, filed Aug. 7, 2012, which is a Continuation of U.S. application Ser. No. 10/752,151, filed on Jan. 5, 2004, and issued as U.S. Pat. No. 8,250,295 on Aug. 21, 2012, each of which are hereby incorporated by reference in their entireties.

FIELD OF THE INVENTION

The present invention relates to computer memory. More particularly, the present invention relates to a four rank memory module.

BACKGROUND OF THE INVENTION

Computers use memory devices for the storage and retrieval of information. These memory devices are often mounted on a memory module to expand the memory capacity of a computer. Sockets on a main board accommodate those memory modules also known as SIMMs or DIMMs.

FIG. 1 is a diagram schematically illustrating a standard memory interface system overview in accordance with a prior art. The system 100 includes a processor 102, a memory controller 104, and a memory module 106. The processor 102 communicates with the memory controller 104 with an address bus 108, a control signal bus 110, and a data bus 112. The memory controller 104 communicates with the memory module 106 with a controller address bus 114, a controller control signal bus 116, and a controller data bus 118. Common system implementations 100 have typically two memory chip selects routed per socket. Common memory module 106 may have two chip selects (one per rank) or four chip selects (two per rank). In one implementation, each chip select from the controller is connected to the corresponding chip select on the memory module. In the second implementation, each chip select from the controller is connected to the two chip selects (those that control one rank) on the memory module. The system chip select signals control individual memory modules ranks. The memory module 106 is coupled to the memory controller 104 through a memory socket.

Standard memory modules such as memory module 106 have either one rank or two rank of memory devices. Each memory device comes in a variety of configurations and families such as 128 Mbit, 256 Mbit, 512 Mbit, and 1024 Mbit DDR SDRAM families. Each of these families is further divided into three distinct flavors such as ×4, ×8, and ×16 data bits. For example, a single 128 Mbit DDR SDRAM family comes in three flavors of:

32 M×4(32 Mega cell of 4-bit each=32 M×4-bit=128 Mbit)

16 M×8(16 Mega cell of 8-bit each=16 M×8-bit=128 Mbit)

8 M×16 (8 Mega cell of 16-bit each=8 M×16-bit=128 Mbit)

The example above illustrates that all three different data bits flavors result in the same density of 128 Mbit. As the number of data bits doubles the cell numbers decrease by half. One can build memory modules with similar densities using different data bits flavors.

One method of building a 512 M Byte standard memory module with ECC (64-bit data plus 8-bit ECC=72-bit) includes using 256 Mbit density families of 32 M×8 to achieve the density of 512 M Byte as follow:

Rank 0=9×(32 M×8) devices=32 M×72-bit which equates to 32 M×8 Bytes+1 Byte of ECC. This yields a total density of 32 M×8 Bytes=256 M Byte.

Rank 1=9×(32 M×8) devices=32 M×72-bit which equates to 32 M×8 Bytes+1 Byte of ECC. This yields a total density of 32 M×8 Bytes=256 M Byte.

Therefore, a two rank memory module with 18 device placements will achieve the 512 M Byte density. Furthermore, it should be noted that a standard DDR 184-pin memory module can only fit nine TSSOP placements per side, or a total of 18 placements of TSSOP per module, considering both front and back sides based on a standard defined height limits by JEDEC.

Because memory devices with lower densities are cheaper and more readily available, it may be advantageous to build the above same density memory module using lower densities devices. However, in order to achieve a density of, for example, 512 M Bytes using 128 Mbit density of 16 M×8 instead, the memory module needs four ranks configured as follows:

Rank 0=9×(16 M×8) devices=16 M×72-bit which equates to 16 M×8 Bytes+1 of ECC. This would give us a total density of 16 M×8 Bytes=128 M Byte.

Rank 1=9×(16 M×8) devices=16 M×72-bit which equates to 16 M×8 Bytes+1 Byte of ECC. This would give us a total density of 16 M×8 Bytes=128 M Byte.

Rank 2=9×(16 M×8) devices=16 M×72-bit which equates to 16 M×8 Bytes+1 Byte of ECC. This would give us a total density of 16 M×8 Bytes=128 M Byte.

Rank 3=9×(16 M×8) devices=16 M×72-bit which equates to 16 M×8 Bytes+1 Byte of ECC. This would give us a total density of 16 M×8 Bytes=128 M Byte.

In order to achieve the above configuration, 4 rows of 9 devices each, totaling 36 placements, are required. As mentioned above, on a standard 184-pin DDR memory module, there is only enough space for 18 TSSOP devices.

The only solution would be, to stack two memory devices together to achieve an extra rank on the same placement space. Although this would solve the placement problem of 36 TSSOP devices, the memory module would still possess four memory ranks. As explained earlier, all standard memory modules have only two chip select signals per memory socket routed. Therefore, such memory module would not be viable.

A need therefore exists for a transparent four rank memory module fitting into a memory socket having two chip select signals routed. A primary purpose of the present invention is to solve these needs and provide further, related advantages.

BRIEF DESCRIPTION OF THE INVENTION

A transparent four rank memory module has a front side and a back side. The front side has a third memory rank stacked on a first memory rank. The back side has a fourth memory rank stacked on a second memory rank. An emulator coupled to the memory module activates and controls one individual memory rank from either the first memory rank, the second memory rank, the third memory rank, or the fourth memory rank based on the signals received from a memory controller.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 5 is a truth table for a transparent four rank memory module in accordance with one embodiment of the present invention.

FIG. 8 is a block diagram schematically illustrating a CPLD in a transparent four rank DDR memory module in accordance with one embodiment of the present invention.

DETAILED DESCRIPTION

Embodiments of the present invention are described herein in the context of a memory module. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with one embodiment of the present invention, the components, process steps, and/or data structures may be implemented using various types of operating systems (OS), computing platforms, firmware, computer programs, computer languages, and/or general-purpose machines. The method can be run as a programmed process running on processing circuitry. The processing circuitry can take the form of numerous combinations of processors and operating systems, or a stand-alone device. The process can be implemented as instructions executed by such hardware, hardware alone, or any combination thereof. The software may be stored on a program storage device readable by a machine.

In addition, those of ordinary skill in the art will recognize that devices of a less general purpose nature, such as hardwired devices, field programmable logic devices (FPLDs), including field programmable gate arrays (FPGAs) and complex programmable logic devices (CPLDs), application specific integrated circuits (ASICs), or the like, may also be used without departing from the scope and spirit of the inventive concepts disclosed herein.

Figure 1:
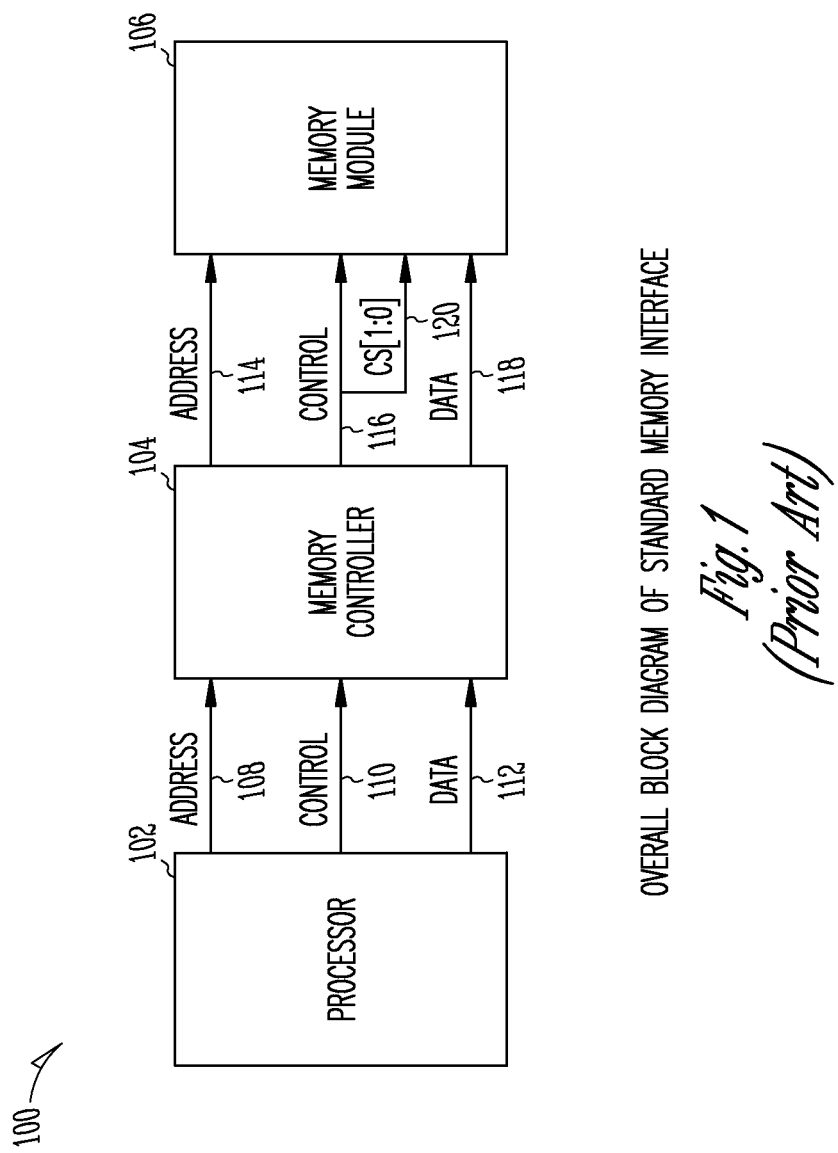
FIG. 1 is a block diagram schematically illustrating a standard memory interface system in accordance with a prior art.
Figure 2:
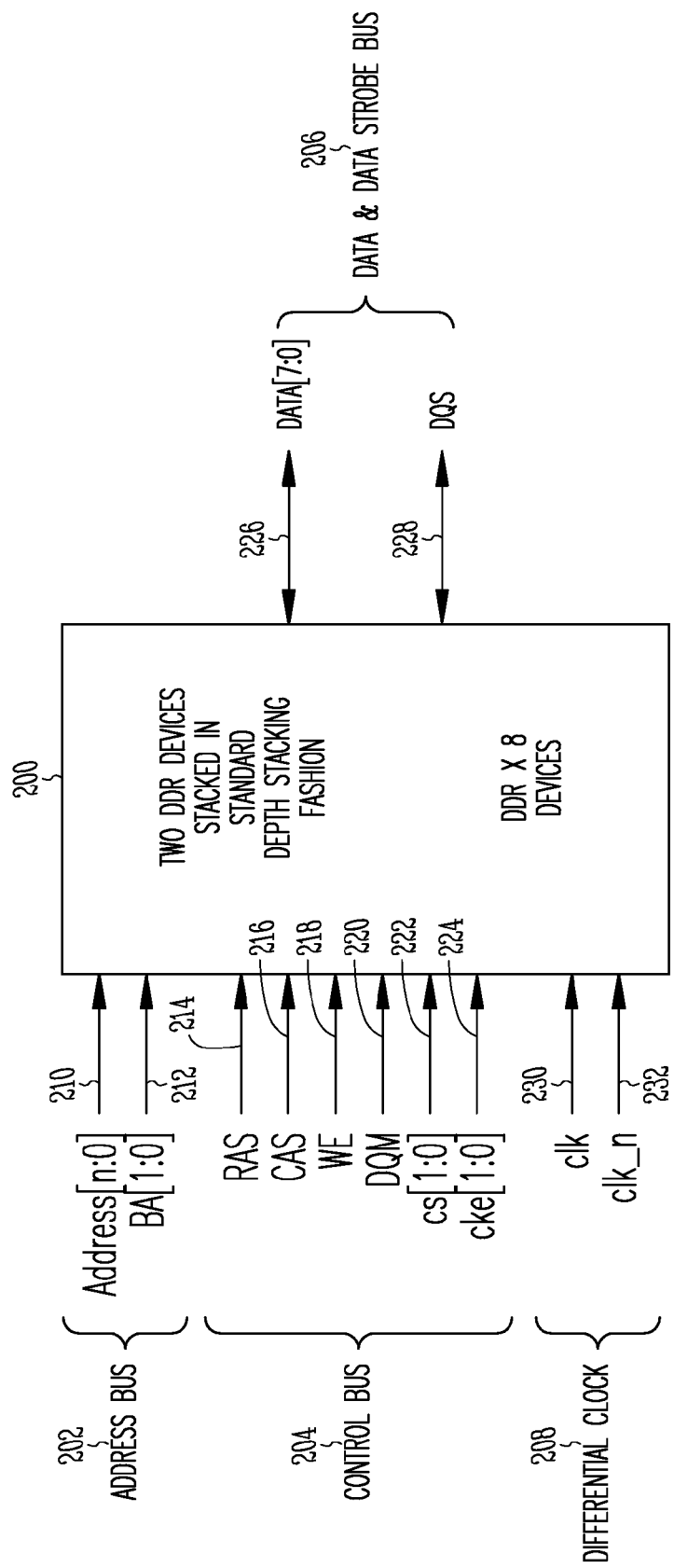
FIG. 2 is a diagram schematically illustrating a stacked DDR device in accordance with one embodiment of the present invention.

FIG. 2 is a block diagram of an example of a standard stacked DDR 8 bit memory device 200 used in a memory module in accordance with one embodiment of the present invention. The memory device 200 interfaces with a memory controller (not shown) with three buses: an address bus 202, a control bus 204, and a data bus 206. A differential clock bus 208 is also coupled to the DDR memory device 200.

The address bus 202 conveys the following signals: address [n:0] 210 and BA[1:0] 212.

The control bus 204 conveys the following signals: RAS 214, CAS 216, WE 218, DQM 220, CS[1:0] 222, and CKE [1:0] 224.

The data bus 206 conveys the following signals: data signals [7:0] 226 and DQS 228.

The differential clock bus 208 includes two signals: clk 230, and clk_n 232.

Figure 3:
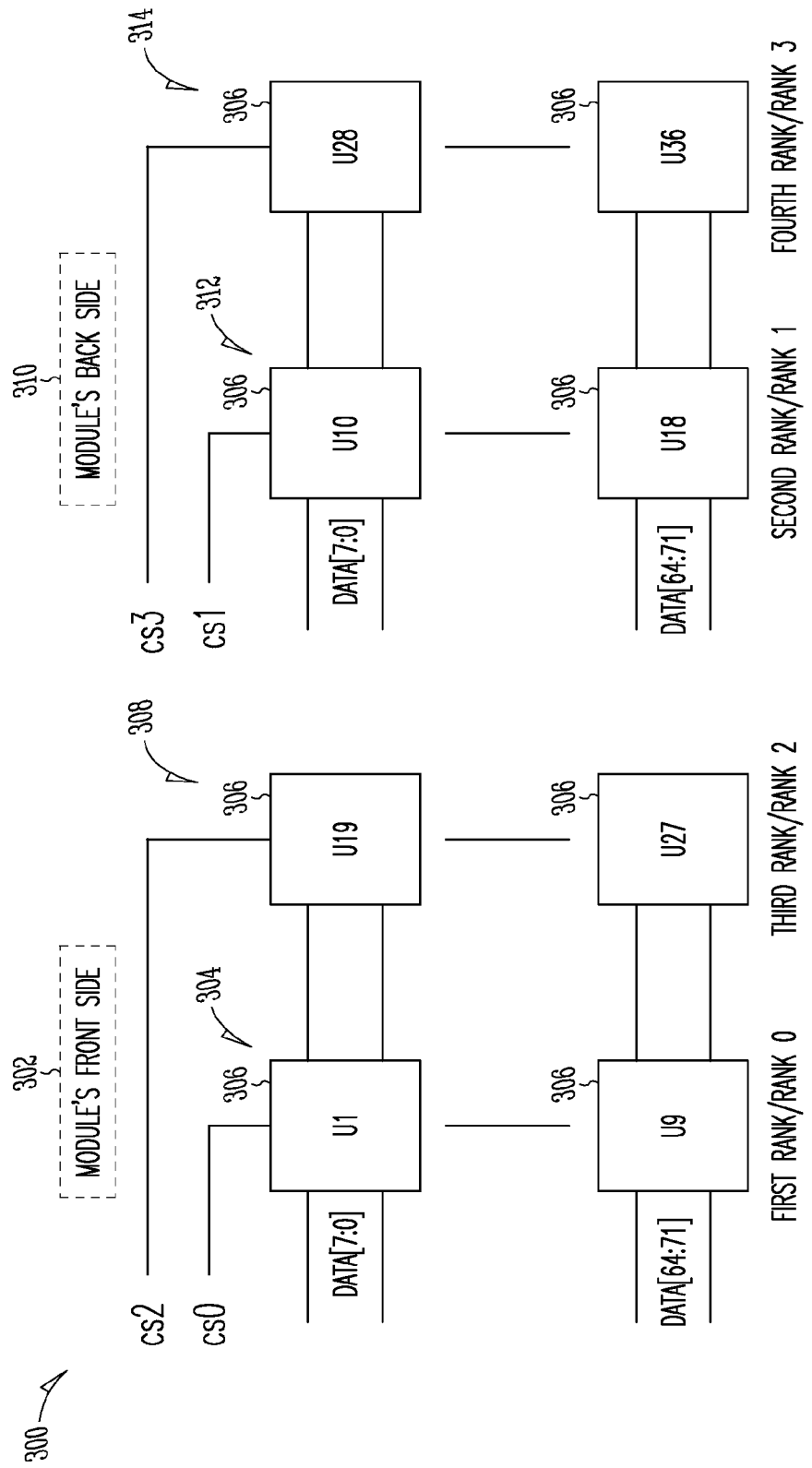
FIG. 3 is a diagram schematically illustrating a transparent four rank DDR memory module in accordance with one embodiment of the present invention.

FIG. 3 illustrates a block diagram of stacked 8 bit memory devices on the front and back side of a memory module 300 in accordance with one embodiment of the present invention. The memory module's front side 302 includes a first rank 304 of memory devices 306 (U1 through U9). The first rank 304 is stacked with a third rank 308 of memory devices 306 (U19 through U27). As illustrated in FIG. 3, data bus [7:0] is connected to both ranks' memory devices 306 (U1 and U19). The remaining data buses are connected to their respective ranks' memory devices 306. A chip select signal is coupled to each rank of memory devices. As illustrated in FIG. 3, chip select signal cs0 is connected to the first rank 304 (from U1 to U9) and chip select signal cs2 is connected to the third rank 308 (from U19 to U27).

The memory module's back side 310 includes a second rank 312 of memory devices 306 (U10 through U18). The second rank 312 is stacked with a fourth rank 314 of memory devices 306 (U28 through U36). As illustrated in FIG. 3, data bus [7;0] is connected to both ranks' memory devices 306 (U10 and U28). The remaining data buses are connected to their respective ranks' memory devices 306. A chip select signal is coupled to each rank of memory devices. As illustrated in FIG. 3, chip select signal cs1 is connected to the second rank 312 (from U10 to U18) and chip select signal cs3 is connected to the fourth rank 314 (from U28 to U36).

FIG. 3 also illustrates a total of four chip select signals (cs0, cs1, cs2, and cs3). As illustrated in FIG. 2, the stacked memory device 200 has only two chip select signals: cs[1:0] 222. In accordance with one embodiment of the invention, the present invention allows the four rank memory modules to communicate with a memory socket having only two chip select signals routed.

Figure 4A:
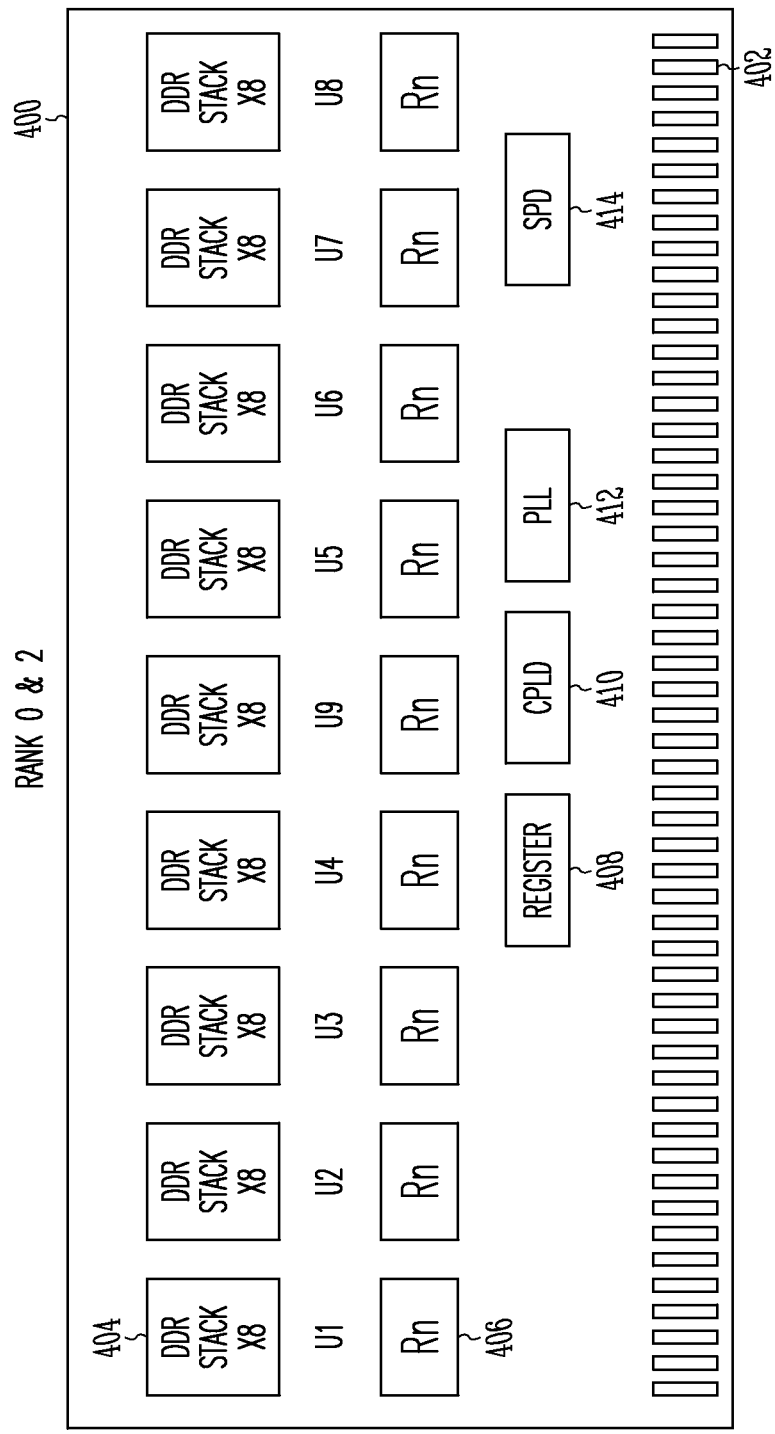
FIG. 4A is a diagram schematically illustrating the front side of a transparent 72-bit registered DDR module in accordance with one embodiment of the present invention.

FIG. 4A illustrates a schematic diagram of the front side of a transparent 72 bit registered DDR module 400 in accordance with one embodiment of the present invention. The memory module 400 includes 92 contact pins 402 on the front side for connecting with a memory socket (not shown). The memory module 400 as illustrated in FIG. 4A includes nine 8 bit stacked memory devices 404, nine corresponding Resistor Network (Rn) 406, a register 408, a CPLD 410, a PLL 412, and a SPD 414. The stacking of the 8 bit stacked memory devices 404 was previously illustrated in FIG. 3. Memory devices 404 (U1 through U9) are mounted on a surface of the front side of the memory module 400. Memory devices 404 (U19 through U27) are respectively stacked on memory devices 404 (U1 through U9). Therefore the front side of the four rank memory modules 400 includes two ranks (rank 0 and rank 2).

The register 408 is used to synchronize the incoming address and control signals with respect to differential clock signals 208 (clk and clk_n). Also, the register 408 may eliminate the loading of 36 devices in case of stacking or loading of 18 devices in case of monolithic memory devices from the main controller by separating the controller side signaling with memory side signal loading fan-out.

The PLL 412 is used to generate a zero-delay buffer off of system side input differential clock signals 208 (clk and clk_n). By using a PLL, the system side will not see the loading effect of either 18 differential clock loads or 36 differentials clock loads in the case of stacking memory devices.

The SPD 414 is a simple I2C interface EEPROM to hold information regarding memory module for BIOS during the power-up sequence.

The CPLD 410 emulates a two rank memory module on the four rank memory module 400. CPLD 410 allows a system having a memory socket with only two chip select signals routed to interface with a four rank memory module where typically a two rank memory module couples with the memory socket. The CPLD 410 determines which rank from the four ranks to activate based upon the address and command signals from a memory controller coupled to the memory module 410. The algorithm of CPLD 410 is further described in FIGS. 5 and 7.

Figure 4B:
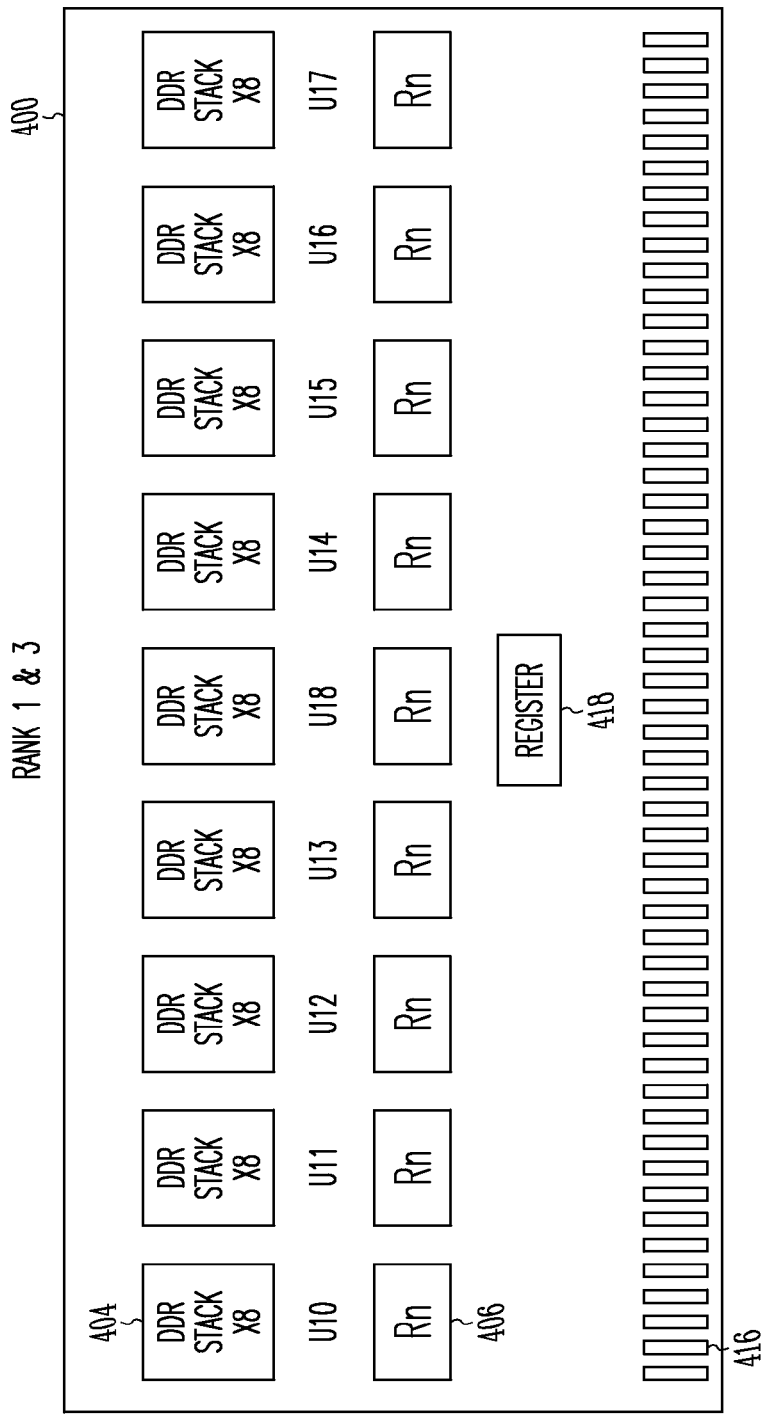
FIG. 4B is a diagram schematically illustrating the back side of a transparent 72-bit registered DDR module in accordance with one embodiment of the present invention.

FIG. 4B illustrates a schematic diagram of the back side of the transparent 72 bit registered DDR module 400 in accordance with one embodiment of the present invention. The memory module 400 includes 92 contact pins 416 on the back side for connecting with a memory socket (not shown). Therefore, memory module 400 has a total of 184 different contact pins on the front and back side. The memory module 400 as illustrated in FIG. 4B includes nine 8 bit stacked memory devices 404, nine corresponding Resistor Network (Rn) 406, another register 418. The stacking of the 8 bit stacked memory devices 404 was previously illustrated in FIG. 3. Memory devices 404 (U10 through U18) are mounted on a surface of the back side of the memory module 400. Memory devices 404 (U28 through U36) are respectively stacked on memory devices 404 (U10 through U18). Therefore the back side of the four rank memory module 400 includes two ranks (rank 1 and rank 3).

FIG. 5 illustrates a truth table used in the process of the CPLD 410 to determine which rank is active (rank 0, rank 1, rank 2, or rank 3). CPLD 410 utilized three variables to determine the active rank: the highest address number Add (n), a first chip select signal (CS0), and a second chip select signal (CS1). As previously mentioned, each memory socket includes two active chip select signals (CS0 and CS1). CPLD 410 combines these two variables (CS0 and CS1) with the address number signal 210 from the address bus 202 to determine the active rank. Add(n) includes the highest binary digit from the address number signal 210. For example, the highest address number Add(n) when the address signal 210 is 10010 would be the first digit to the left: "1".

As illustrated in FIG. 5, rank 0 is active when the Add(n) is 0, CS1 is 1, and CS0 is 0. Rank 1 is active when the Add(n) is 0, CS1 is 0, and CS0 is 1. Rank 2 is active when the Add(n) is 1, CS1 is 1, and CS0 is 0. Rank 3 is active when the Add(n) is 1, CS1 is 0, and CS0 is 1.

Because the row address and column address may differ between different memory device densities, the CPLD may employ two different decoding schemes: a Row Address Decoding scheme, and a Column Address Decoding scheme. The following non-limiting example is used for illustration purposes.

A 512 MByte memory module may be build with either two rank of 256 MByte density per rank or four ranks of 128 MByte density per rank. However, a 128 Mbit DDR SDRAM has different characteristics from a 256 Mbit DDR SDRAM device.

A 128 Mbit DDR SDRAM (16 M×8) has the following characteristics:

| Configuration | 4M × 8 × 4 |
|---|---|
| Refresh Rate | 4K |
| Row Address | A0-A11 |
| Column Address | A0-A9 |

A 256 Mbit DDR SDRAM (32 M×8) has the following characteristics:

| Configuration | 8M × 8 × 4 |
|---|---|
| Refresh Rate | 8K |
| Row Address | A0-A12 |
| Column Address | A0-A9 |

The size of the column addresses (A0-A9) for both 128 Mbit DDR SDRAM and 256 Mbit DDR SDRAM devices match. However, the size of the row address for the 128 Mbit DDR SDRAM differs by one row address line from the 256 Mbit DDR SDRAM (A12). The CPLD 410 uses a Row Address Decoding scheme to emulate a two rank based on 256 Mbit DDR SDRAM Device Technology memory module with a four rank based on 128 Mbit DDR SDRAM Device Technology memory module. Under this scheme, address lines A0-A11 go to module register 408 and 418 and address lines A12 goes into CPLD 410 along with CS0 and CS1 for proper decoding. Therefore, the extra address line A12 is used by the CPLD to determine which rank (from the four ranks) is active. The decoding is performed as previously illustrated in FIG. 5 above. For example, if address bus (A12-A0) has "1000010101010" and CS0 is "0" and CS1 is "1", then rank 2 is activated. In this present example, Add(n) for A12 is "1". The Row Address Decoding scheme is further illustrated in FIG. 6A.

Figure 6A:
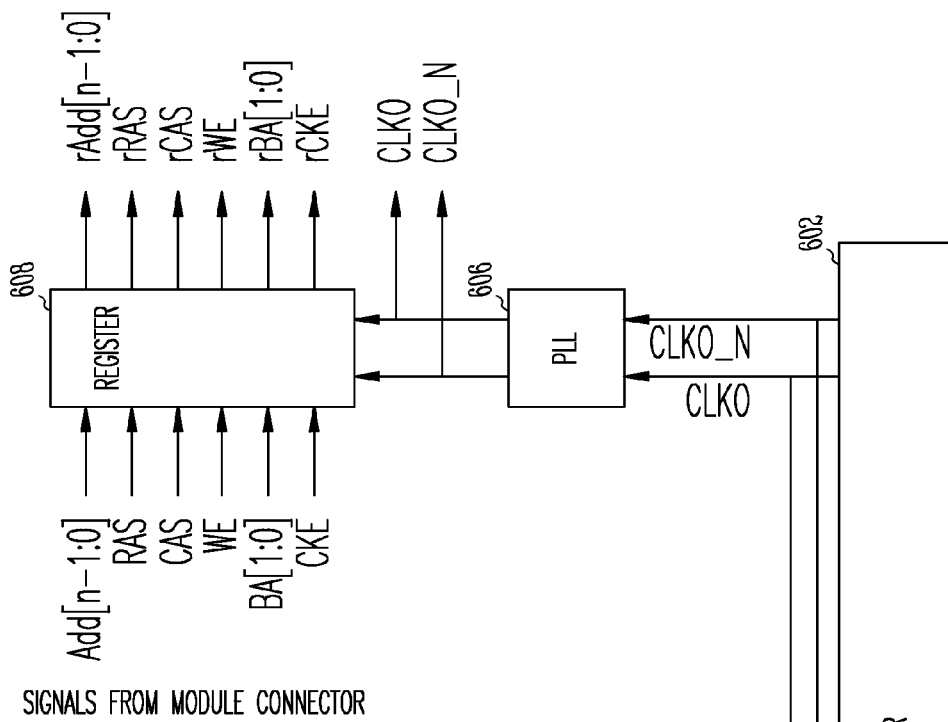
FIG. 6A is a block diagram schematically illustrating a row address decoding system for a transparent four rank memory module in accordance with one embodiment of the present invention.
Figure 6A:
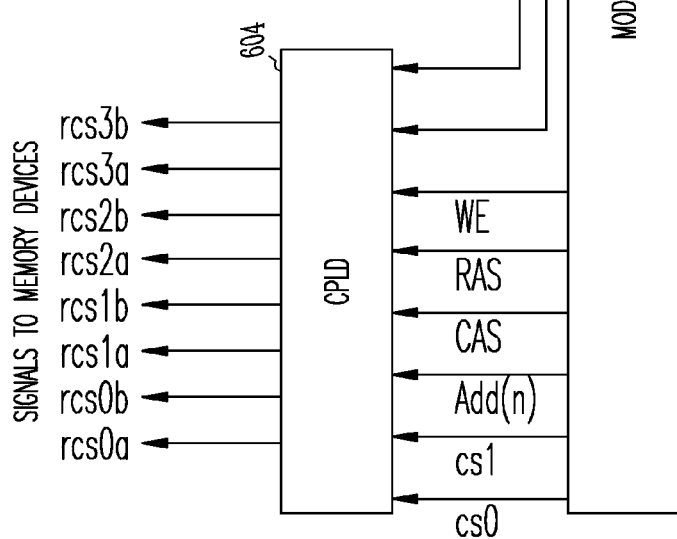

FIG. 6A illustrates a method for decoding row addresses in accordance with one embodiment of the present invention. A module connector 602 (for example, the contact pins 402 and 416) sends signals to the CPLD 604, PLL 606, and register 608. The signals sent to CPLD 604 include cs0, cs1, Add(n), CAS, RAS, WE, CLK0, and CLK0_N. The signals sent to PLL 606 include CLK0, and CLK0_N. PLL relays the CLK0 and CLK0_N signals to register 608 and memory devices 306. Register 608 also receives the following signals from module connector 602: Add[n−1;0], RAS, CAS, WE, BA[1:0], CKE.

As illustrated in the example above, the 256 Mbit memory devices has an extra row address line (A12) when compared to the 128 Mbit memory devices. Register 608 of a four rank memory module emulating a two bank memory module receives an address with an address size matching the address size of the lower density memory devices (128 Mbit), i.e. A0-A11. In other words, the address signal from the module connector 608 does not include the extra row address line A12.

CPLD 604 also ensures that all commands for a two rank memory module conveyed by the module connector 602 are also performed on the four rank memory modules. For example, CPLD 604 generates rcs2 and rcs3, besides rcs0 and rcs1 off of CS0, CS1 and Add(n) from the memory controller side. CPLD 604 also generates rcs2 when CS0 Auto Precharge all Banks Commands are issued. CPLD 604 also generates rcs3 when CS1 Auto Precharge all Banks Commands are issued. CPLD 604 also generates rcs2 when CS0 Auto Refresh Commands are issued. CPLD 604 also generates rcs3 when CS1 Auto Refresh Commands are issued. CPLD 604 also generates rcs2 when CS0 Load Mode Register Commands are issued. CPLD 604 also generates rcs3 when CS1 Load Mode Register Commands are issued.

However, as previously mentioned, a memory module may also be built using two device families which only differs in their column address size, and have the same row address size. The following example illustrates this situation and describes the Column Decoding Scheme.

A 1024 Mbyte memory module may be build with either two rank of 512 MByte density per rank or four ranks of 256 MByte density per rank. However, the 256 Mbit DDR SDRAM has different characteristics from a 512 Mbit DDR SDRAM.

A 256 Mbit DDR SDRAM (32 M×8) has the following characteristics:

| | |
|---|---|
| Configuration | 8M × 8 × 4 |
| Refresh Rate | 8K |
| Row Address | A0-A12 |
| Column Address | A0-A9 |

A 512 Mbit DDR SDRAM (64 M×8) has the following characteristics:

| | |
|---|---|
| Configuration | 16M × 8 × 4 |
| Refresh Rate | 8K |
| Row Address | A0-A12 |
| Column Address | A0-A9, A11 |

The size of the row addresses (A0-A9) for both 256 Mbit DDR SDRAM and 512 Mbit DDR SDRAM devices match. However, the size of the column address for the 256 Mbit DDR SDRAM differ by one address line from the 512 Mbit DDR SDRAM (A11). The CPLD 410 uses the Column Address Decoding scheme to emulate a two ranks 512 Mbit based DDR SDRAM device Technology memory module with a four ranks 256 Mbit based DDR SDRAM device Technology memory module. Under this scheme, address lines A0-A12 go to module register 408 and 418 and address lines A11 goes into CPLD 410 along with CS0 and CS1 for proper decoding. Therefore, the address line A11 is used by the CPLD to determine which rank (from the four ranks) is active. The decoding is performed as previously illustrated in FIG. 5 above. For example, if address bus (A11, A9-A0) has "100110101010" and CS0 is "0" and CS1 is "1", then rank 2 is activated. In this present example, Add(n) for A11 is "1". The Column Address Decoding scheme is further illustrated in FIG. 6B.

Figure 6B:
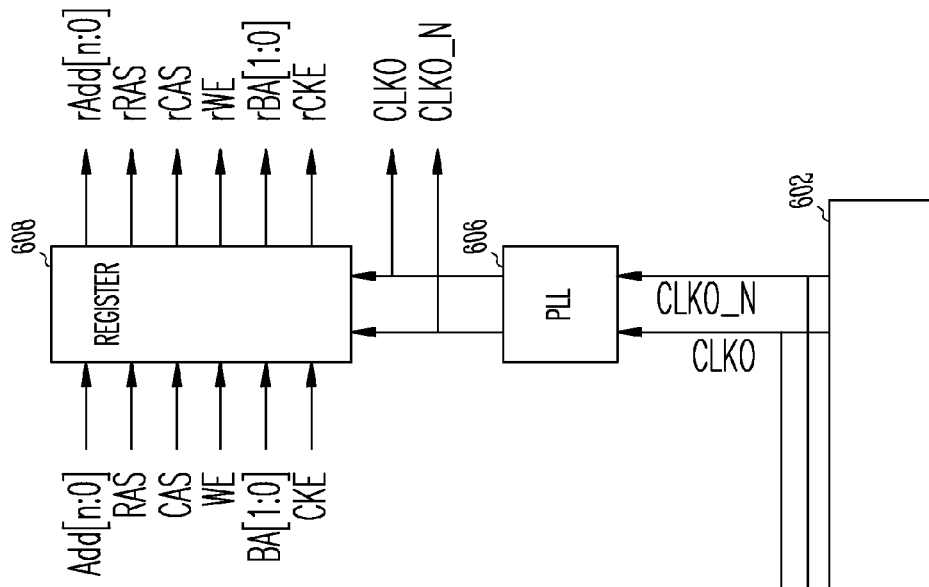
FIG. 6B is a block diagram schematically illustrating a column address decoding system for a transparent four rank memory module in accordance with one embodiment of the present invention.
Figure 6B:
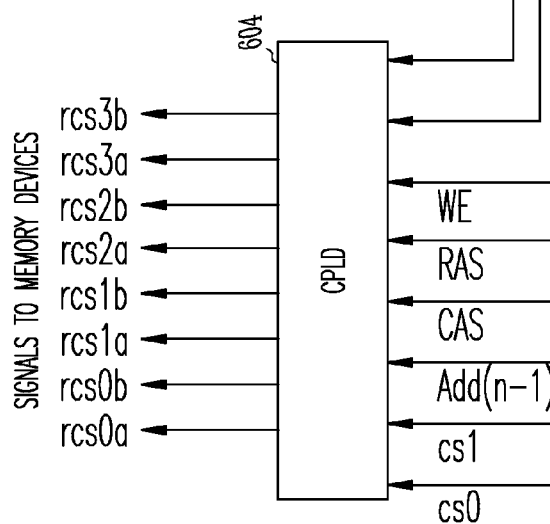

FIG. 6B illustrates a method for decoding column addresses in accordance with one embodiment of the present invention. A module connector 602 (for example, the contact pins 402 and 416) sends signals to the CPLD 604, PLL 606, and register 608. The signals sent to CPLD 604 include CS0, CS1, Add(n−1), CAS, RAS, WE, CLK0, and CLK0_N. The signals sent to PLL 606 include CLK0, and CLK0_N. PLL relays CLK0 and CLK0_N signals to register 608 and memory devices 306. Register 608 also receives the following signals from module connector 602: Add[n;0], RAS, CAS, WE, BA[1:0], CKE.

As illustrated in the example above, the 512 Mbit memory devices has an extra column address line (A11) when compared to the 256 Mbit memory devices. Register 608 of a four rank memory module emulating a two rank memory module receives an address with an address size matching the address size of the lower density memory devices (256 Mbit), i.e. A0-A12.

CPLD 604 also ensures that all commands for a two rank memory module conveyed by the module connector 602 are also performed on the four rank memory modules. For example, CPLD 604 generates rcs2 and rcs3, besides rcs0 and rcs1 off of CS0, CS1 and Add(n) from the memory controller side. CPLD 604 also generates rcs2 when CS0 Auto Precharge all Banks Commands are issued. CPLD 604 also generates rcs3 when CS1 Auto Precharge all Banks Commands are issued. CPLD 604 also generates rcs2 when CS0 Auto Refresh Commands are issued. CPLD 604 also generates rcs3 when CS1 Auto Refresh Commands are issued. CPLD 604 also generates rcs2 when CS0 Load Mode Register Commands are issued. CPLD 604 also generates rcs3 when CS1 Load Mode Register Commands are issued.

It should be noted that the internal circuitry in the CPLD 410 for Row Address Decoding and Column Address Decoding are different. In particular, in the Column Address Decoding scheme, a unique decoding circuitry is required because in a standard DDR memory module there is only one set of address lines and memory organized as a matrix in such that in order to access an ×4, ×8 or ×16 cell, two set of addresses needs to be provided. First, the Row address needs to be provided with the proper control and command signals then on a separate cycle, the Column address needs to be provided with its proper control and command signals in order to read or write to that particular cell.

Figure 7:
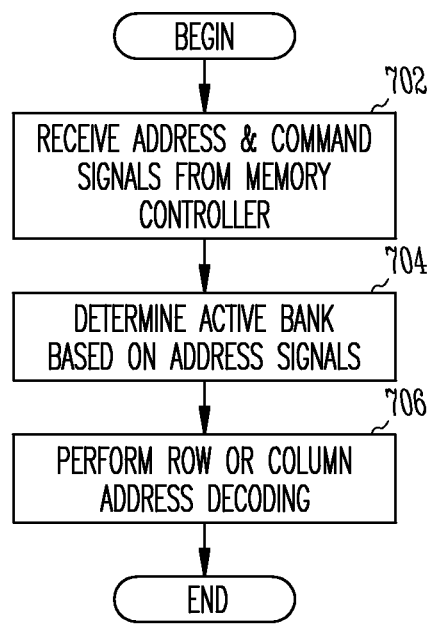
FIG. 7 is a flow diagram schematically illustrating a method for emulating a two rank memory module.

FIG. 7 illustrates a method for emulating a two rank memory module with a four rank memory module in accordance with one embodiment of the present invention. At 702, the memory module receives a command signal and address signal from a memory controller. The memory controller addressed the command signal and address signal to a two rank memory module. The command signal includes CS0, CS1, CKE, CAS, RAS, and WE. The address signal includes Add(n). At 704, the CPLD of the four rank memory module determines which rank should be active based on the address and command signals (cs0, cs1, and Add(n)). This determination was previously described using the truth table illustrated in FIG. 5. At 706, the CPLD performs either a Row Address Decoding scheme or a Column Address Decoding scheme as previously described to relay the command signals.

It should be noted that the physical address lines and logical address lines are different in this methodology. This is a non-linear addressing versus SRAM which uses linear addressing. In this methodology, a much lower number of pins are used to access the same amount of memory locations as a SRAM device with longer latency due to multiple cycle of providing the Row and Column logical addresses.

FIG. 8 is a block diagram schematically illustrating the internal circuitry of a CPLD used in the transparent four rank DDR memory module. CS0 signal and CS1 signal generate a CS internal signal through logical device 802. The CS signal is transmitted to Load mode register 804, auto refresh 806, and auto precharge detection 808 sub circuitries.

The Load Mode Register circuitry 804 also receives Chip Select (CS) signal, Row Address Strobe (RAS) signal, Column Address Strobe (CAS) signal, and Write Enable signal (WE). This module 804 detects load mode register cycle if inputs are asserted properly to indicate LMR command.

The Auto Refresh circuitry 806 receives Chip Select (CS) signal, Row Address Strobe (RAS) signal, Column Address Strobe (CAS) signal, and Write Enable signal (WE). This module 806 detects auto refresh cycle if inputs are asserted properly to indicate Auto Refresh command.

The Auto Precharge circuitry 808 receives Chip Select (CS) signal, Row Address Strobe (RAS) signal, Column Address Strobe (CAS) signal, and Write Enable (WE) signal. This module 808 detects auto precharge cycle if inputs are asserted properly to indicate auto precharge command.

The output of all three sub circuitries (LMR 804, auto refresh 806 and auto precharge 808) will go to a logical device OR 810 which will drive another level of OR logic 812 and 814 along with either highest address line (814) or it's inverted state (812).

The inverted state drives both MUX wcs0 and wcs1 blocks 816 and 818 which goes to a respective register 820 and 822 and gets fan-out into rcs0a and rcs0b or rcs1a or rcs1b eventually.

The non-inverted state will drive both MUX wcs2 and wcs3 blocks 824 and 826 which goes to a respective register 828 and 830 and gets fan-out into rcs2a and rcs2b or rcs3a or rcs3b eventually.

Many other families of memory devices or densities of memory devices (not shown) may be used to build the four rank memory module. Those of ordinary skill in the art will appreciate that the example of four rank memory module described above is not intended to be limiting and that other configuration can be used without departing from the inventive concepts herein disclosed.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A memory module connectable to a computer system, the memory module comprising:
    a board;
    a first plurality of double-data-rate (DDR) memory devices mounted to the board, the first plurality of DDR memory devices arranged in a first number of ranks; and
    a circuit that is coupled to said board and that receives from the computer system a set of input control signals that includes a set of first chip select signals and an address signal, and that generates a set of second chip select signals based at least in part upon values of said set of first chip select signals and a portion of the address signal;
    wherein the size of the received set of first chip select signals is smaller than the size of the generated set of second chip select signals;
    wherein the received set of first chip select signals includes at least two chip select signals and the generated set of second chip select signals includes at least four chip select signals;
    wherein the chip select signals of the generated set of second chip select signals correspond to the first number of ranks;
    wherein the chip select signals of the received set of first chip select signals correspond to a second plurality of DDR memory devices arranged in a second number of ranks;
    wherein the second number of ranks is less than the first number of ranks;
    wherein at least one signal of the generated set of second chip select signals has a value to select DDR memory devices of a respective rank of the first number of ranks;
    wherein the circuit provides one or more of the set of input control signals to said respective selected rank;
    wherein the set of input control signals includes RAS, CAS, WE, and BA;
    wherein the circuit includes an emulator and a register;
    wherein the emulator receives from the computer system at least a portion of the set of input control signals that includes: RAS, CAS, WE, the received set of first chip select signals, and the portion of the address signal;
    wherein the emulator generates the generated set of second chip select signals in response to at least RAS, CAS, WE, and the received set of first chip select signals;
    wherein the emulator generates the generated set of second chip select signals with only one signal of the generated set of second chip signals having a value to select DDR memory devices of a respective rank of the first number of ranks, in response to a portion of the input control signals, including the portion of the address signal, received by the emulator;
    wherein the emulator generates the generated set of second chip select signals with at least two signals of the generated set of second chip signals having values to select DDR memory devices of at least two respective ranks of the first number of ranks, in response to a portion of the input control signals indicating a refresh, received by the emulator;
    wherein the register receives at least another portion of the set of input control signals that includes RAS, CAS, WE, BA, and the remaining portion of the address signal; and
    wherein the register provides one or more of the input control signals received by the register to DDR memory devices of said at least one respective selected rank.

2. The memory module of claim 1, wherein the number of DDR memory devices per rank in the first number of ranks is the same as the number of DDR memory devices per rank in the second number of ranks.

3. The memory module of claim 1, wherein the number of DDR memory devices per rank in the first number of ranks and the number of DDR memory devices per rank in the second number of ranks is 9.

4. The memory module of claim 1, wherein the first number of ranks is twice the second number of ranks.

5. The memory module of claim 1, wherein the first number of ranks is four and the second number of ranks is two.

6. The memory module of claim 1, wherein the received set of first chip select signals consists of two signals and the generated set of second chip select signals consists of four signals.

7. The memory module of claim 1, wherein the portion of the address signal includes only a single bit.

8. The memory module of claim 1, wherein the first plurality of DDR memory devices and the second plurality of DDR memory devices have the same memory density.

9. The memory module of claim 1, wherein the received set of first chip select signals includes a first received chip select signal and a second received chip select signal, wherein the received first and second chip select signals are configured to always have opposite digital values during generation of the set of second chip select signals for use in a read access or a write access operation.

10. The memory module of claim 1, wherein the number of DDR memory devices in the first plurality of DDR memory devices mounted to the board is more than the number of DDR memory devices in the second plurality of DDR memory devices.

11. A memory module connectable to a computer system, the memory module comprising:
- a board;
- a first plurality of double-data-rate (DDR) memory devices mounted to the board, the first plurality of DDR memory devices arranged in a first number of ranks; and
- a circuit that is coupled to said board and that receives from the computer system a set of input control signals that includes a set of first chip select signals and an address signal, and that generates a set of second chip select signals based at least in part upon values of said set of first chip select signals and a portion of the address signal;
- wherein the size of the received set of first chip select signals is smaller than the size of the generated set of second chip select signals;
- wherein the received set of first chip select signals includes at least two chip select signals and the generated set of second chip select signals includes at least four chip select signals;
- wherein the chip select signals of the generated set of second chip select signals correspond to the first number of ranks;
- wherein the chip select signals of the received set of first chip select signals correspond to a second plurality of DDR memory devices arranged in a second number of ranks;
- wherein the second number of ranks is less than the first number of ranks;
- wherein the set of input control signals includes RAS, CAS, WE, and BA;
- wherein the circuit includes an emulator that receives from the computer system at least a portion of the set of input control signals that includes: RAS, CAS, WE, the received set of first chip select signals, and the portion of the address signal;
- wherein the emulator generates the generated set of second chip select signals in response to at least RAS, CAS, WE, and the received set of first chip select signals;
- wherein the emulator generates the generated set of second chip select signals with only one signal of the generated set of second chip signals having a value to select DDR memory devices of a respective rank of the first number of ranks, in response to a portion of the input control signals, including the portion of the address signal, received by the emulator;
- wherein the emulator generates the generated set of second chip select signals with at least two signals of the generated set of second chip signals having values to select DDR memory devices of at least two respective ranks of the first number of ranks, in response to a portion of the input control signals indicating a refresh, received by the emulator;
- wherein the emulator provides individual chip select signals from the generated set of second chip select signals to DDR memory devices of individual ranks of the first number of ranks; and
- wherein the circuit provides one or more of RAS, CAS, WE, BA, and a remaining portion of the address signal to DDR memory devices of at least the respective selected rank of the first number of ranks.

12. The memory module of claim 11, wherein the emulator allows the computer system, which provides the number of chip select signals in the received set of first chip select signals, to interface with the first number of ranks, wherein the number of chip select signals in the received set of first chip select signals corresponds to the second number of ranks, and wherein the number of chip select signals in the generated set of second chip select signals corresponds to the first number of ranks.

13. The memory module of claim 11, wherein the circuit provides the one or more of RAS, CAS, WE, BA, and the remaining portion of the address signal to individual ones of the first number of ranks.

14. The memory module of claim 11,
- wherein the circuit includes a register;
- wherein the register receives at least another portion of the set of input control signals that includes: RAS, CAS, WE, BA, and the remaining portion of the address signal; and
- wherein the register provides the one or more of RAS, CAS, WE, BA, and the remaining portion of the address signal to at least the respective selected rank of the first number of ranks.

15. The memory module of claim 11,
- wherein the number of chip select signals of the generated set of second chip select signals corresponds to a first number of DDR memory devices arranged in the first number of ranks; and
- wherein the number of chip select signals of the received set of first chip select signals corresponds to a second number of DDR memory devices arranged in the second number of ranks.

16. The memory module of claim 11, wherein the received set of first chip select signals includes a first received chip select signal and a second received chip select signal, wherein the received first and second chip select signals are configured to always have opposite digital values during generation of the set of second chip select signals for use in a read access or a write access operation.

17. A memory module connectable to a computer system, the memory module comprising:
- a board;
- a first plurality of double-data-rate (DDR) memory devices mounted to the board, the first plurality of DDR memory devices arranged in a first number of ranks; and
- a circuit that is coupled to said board and that receives from the computer system a set of input control signals that includes a set of first chip select signals and an address signal, and that generates a set of second chip select signals based at least in part upon values of said set of first chip select signals and a portion of the address signal;
- wherein the size of the received set of first chip select signals is smaller than the size of the generated set of second chip select signals;

wherein the second number of ranks is less than the first number of ranks;

wherein the received set of first chip select signals includes a first received chip select signal and a second received chip select signal, wherein the received first and second chip select signals are configured to always have opposite digital values during generation of the set of second chip select signals for use in a read access or a write access operation;

wherein the chip select signals of the generated set of second chip select signals correspond to the first number of ranks;

wherein the chip select signals of the received set of first chip select signals correspond to a second plurality of DDR memory devices arranged in a second number of ranks;

wherein the set of input control signals includes RAS, CAS, WE, and BA;

wherein the circuit includes an emulator;

wherein the emulator allows the computer system, which provides the number of chip select signals in the received set of first chip select signals, to interface with the first number of ranks, wherein the number of chip select signals in the received set of first chip select signals corresponds to the second number of ranks, and wherein the number of chip select signals in the generated set of second chip select signals corresponds to the first number of ranks;

wherein the emulator receives from the computer system at least a portion of the set of input control signals that includes: RAS, CAS, WE, the received set of first chip select signals, and the portion of the address signal;

wherein the emulator generates the generated set of second chip select signals in response to at least RAS, CAS, WE, and the received set of first chip select signals;

wherein the emulator generates the generated set of second chip select signals with only one signal of the generated set of second chip signals having a value to select DDR memory devices of a respective rank of the first number of ranks, in response to a portion of the input control signals, including the portion of the address signal, received by the emulator;

wherein the emulator generates the generated set of second chip select signals with at least two signals of the generated set of second chip signals having values to select DDR memory devices of at least two respective ranks of the first number of ranks, in response to a portion of the input control signals indicating a refresh, received by the emulator;

and wherein the emulator provides individual chip select signals from the generated set of second chip select signals to DDR memory devices of individual ranks of the first number of ranks.

18. The memory module of claim 17, wherein a number of DDR memory devices in the first plurality of DDR memory devices mounted to the board is more than a number of DDR memory devices in the second plurality of DDR memory devices.

19. The memory module of claim 17, wherein the circuit includes a register that receives at least another portion of the set of input control signals that includes RAS, CAS, WE, BA, and the remaining portion of the address signal; and wherein the register provides the one or more of RAS, CAS, WE, BA, and the remaining portion of the address signal to DDR memory devices of at least the respective selected rank of the first number of ranks.

* * * * *